(12) United States Patent
van der Avoort et al.

(10) Patent No.: US 8,294,534 B2
(45) Date of Patent: Oct. 23, 2012

(54) RESONATOR

(75) Inventors: Casper van der Avoort, Waalre (NL); Jozef Thomas Martinus Van Beek, Rosmalen (NL); Johannes van Wingerden, Hardinxveld-Giessendam (NL); Joep Bontemps, Eindhoven (NL); Robert James Pascoe Lander, Leuven (BE)

(73) Assignee: NXP B.V., Eindhoven (NL)

( * ) Notice: Subject to any disclaimer, the term of this patent is extended or adjusted under 35 U.S.C. 154(b) by 220 days.

(21) Appl. No.: 12/888,185

(22) Filed: Sep. 22, 2010

(65) Prior Publication Data

US 2011/0127625 A1 Jun. 2, 2011

(30) Foreign Application Priority Data

Sep. 22, 2009 (EP) .................................. 09252251

(51) Int. Cl.
*H03H 9/02* (2006.01)
*H01L 21/00* (2006.01)
(52) U.S. Cl. ............................ 333/186; 333/197; 438/50
(58) Field of Classification Search .................. 333/186, 333/197, 200; 438/50, 54
See application file for complete search history.

(56) References Cited

U.S. PATENT DOCUMENTS

| 7,202,761 | B2 | 4/2007 | Lutz et al. | |
| 2006/0186971 | A1 | 8/2006 | Lutz et al. | |
| 2010/0019869 | A1 | 1/2010 | Durand et al. | |
| 2011/0012693 | A1* | 1/2011 | Casset et al. .................. | 333/186 |

FOREIGN PATENT DOCUMENTS

| EP | 2 144 369 A1 | 1/2010 |
| WO | 98/29943 A1 | 7/1998 |
| WO | 2007/072409 A2 | 6/2007 |

OTHER PUBLICATIONS

Damiano Pasini: 'Shape and Material Selection for Optimizing Flexural Vibrations in Multilayered Resonators,' Journal of Microelectromechanical Systems, IEEE Service Center, vol. 15, No. 6 pp. 1745-1758, (Dec. 1, 2006).

R. Melamud, et al. : 'Temperature-Compensated High-Stability Silicon Resonators,' Applied Physics Letters, (Jun. 14, 2007).

European Extended Search Report for Patent Appln. No. EP09252251.5 (Mar. 19, 2010).

van der Avoort, C. "The Effects of Thermal Oxidation of Mems Resonators on Temperature Drift and Absolute Frequency," IEEE 22nd Int'l. Conf. On Micro Electro Mechanical Systems (Jan. 2009), pp. 654-56.

* cited by examiner

*Primary Examiner* — Hoai V Pham

(57) ABSTRACT

A resonator comprising a beam formed from a first material having a first Young's modulus and a first temperature coefficient of the first Young's modulus, and a second material having a second Young's modulus and a second temperature coefficient of the second Young's modulus, a sign of the second temperature coefficient being opposite to a sign of the first temperature coefficient at least within operating conditions of the resonator, wherein the ratio of the cross sectional area of the first material to the cross sectional area of the second material varies along the length of the beam, the cross sectional areas being measured substantially perpendicularly to the beam.

14 Claims, 6 Drawing Sheets

1. Trench Patterning

2. Deposition Diffusion Mask

3. Patterning Diffusion Mask

4. Deposition Diffusion Source & Drive in

5. HF Vapour etch

6. Oxidation

RESONATOR

This application claims the priority under 35 U.S.C. §119 of European patent application no. 09252251.5, filed on Sep. 22, 2009, the contents of which are incorporated by reference herein.

BACKGROUND

Timing references in electronics have been realised mechanically for a long time. Quartz crystal resonators in an oscillator package are present in many applications. The high quality factor and low temperature drift of quartz crystal resonators means that they have high stability and are therefore chosen as a timing reference in electronics.

MEMS resonators, on the other hand are devices formed from miniaturised components operatively arranged on a substrate. MEMS resonators are typically constructed through the use of lithographic and other micro-fabrication techniques to produce, for example, sensors and actuators. Micromechanical resonators are generally formed on a silicon substrate of the type used for integrated circuits, and may be manufactured using CMOS technology.

Recently MEMS resonators have been developed with a view to replacing quartz in the timing market. These resonators have high Q factors (which is a measure for frequency selectivity) combined with extreme form factors. Typical dimensions of conventional quartz oscillator packages are in millimeters, whereas MEMS oscillators comprising a resonator and driving electronics can be fabricated in thin-film technology leading to a thickness of less than 100 micrometer. However the beneficial form factor of a MEMS resonator alone is not enough to make it a candidate for most timing reference applications. This is because a problem associated with MEMS resonators is that the resonance frequency of a MEMS resonator is temperature dependent. This means that the resonance frequency will not be constant over an operating temperature range.

Although there are many factors that affect the temperature dependency of the frequency of a resonator, the temperature dependent modulus of elasticity (or Young's modulus) of silicon, the material most often used to form the resonator, largely determines the temperature coefficient of the resonator. When a resonator is formed from silicon, the nominal value of the Young's modulus in the <100> direction, together with the negative temperature dependency of silicon is well known. This means that the frequency of a resonator vibrating solely in the <100> direction can be predicted accurately for a given geometry at room temperature. Because of the negative temperature coefficient (TC) of the Young's modulus, the frequency of the resonator also has a negative TC.

In order to overcome the problem of the temperature dependence of the resonant frequency of a MEMS resonator having a negative temperature coefficient, it is known to add to such a resonator, a material of positive temperature coefficient. By adding such a material to the resonator, the overall temperature coefficient may become less negative, and within certain tolerances may be reduced to zero. Under such circumstances the frequency of the resonator would become temperature independent.

It is known that silicon dioxide possess a positive temperature coefficient and it is known to coat a resonator formed from silicon with a silicon dioxide skin in order to compensate for the dependence of the resonant frequency.

One known method comprises the steps of applying a skin of silicon dioxide around a suspended silicon resonator. This method is referred to as global oxidation since all the silicon over the entire surface of the resonator (top area, bottom area, and sidewalls) will be transferred to silicon dioxide at substantially the same rate.

Another known method is known as local oxidisation in which only a part of the silicon resonator is either transferred to, or replaced by silicon dioxide.

It is known that resonators formed solely from silicon exhibit a negative temperature drift of 30 ppm/K on their resonance frequency. This means that over a range of 100° C., the frequency will change by 3000 ppm. This value of –30 ppm/K is referred to as the linear temperature coefficient (TC) of the resonator.

After a resonator formed from silicon has been coated with a silicon dioxide layer, the linear temperature coefficient has a close to linear relationship with the thickness of the grown oxide layer.

It has been found that for an oxide layer of approximately 300 nm, the linear TC is zero. This value depends on the thickness of the resonator, as the thickness is much smaller than any of the other dimensions defining the geometry of the resonating body. This means that the frequency of the resonator will no longer vary substantially with temperature and thus will be almost temperature independent.

The frequency of a resonator depends on other factors as well as on the ambient temperature. This means that if the variance of the frequency with respect to temperature is reduced to a small value such that the TC is close to zero, it is still not possible to produce a number of resonators which will have exactly the same resonance frequency, since the frequency will depend on other factors. In particular, the frequency of the resonator has a close to linear relationship with the thickness of an oxide layer forming a skin around the material forming the resonator (typically silicon). For an oxide thickness of 300 nm the change in frequency relative to the frequency of an unoxidized resonator ignoring any variation caused by temperature is over 100000 ppm. It can be seen therefore that the effects on frequency caused by a variation in oxide thickness are much larger than the changes in frequency over 100° temperature range.

Since the frequency is highly dependent on the oxide thickness, it is unsurprising that large frequency spreads exist in MEMS resonators having a thick oxide.

In other words, whilst an oxide layer may reduce the TC of a resonator, the frequency of the resonator will alter with variations in the thickness of the layer.

Silicon dioxide is usually applied using a thermal oxidation process. Such a process has a relative error of a few percent. For example, for an intended oxide layer thickness of 300 nm, the layer will in fact have a thickness of between 293 nm and 308 nm meaning that there is a relative error of 5%. This means that the resulting absolute frequency of the resonator may have a spread falling within the range of thousands of parts per million. This range is too large for most applications.

BRIEF DESCRIPTION OF THE DRAWINGS

FIGS. 6a to 6h are schematic representations of a fourth embodiment of the invention in which the silicon substrate forming the beam forming part of the resonator is implanted with nitrogen; wherein FIGS. 6a, 6c, 6e and 6g are cross-sectional representations showing stages of the method, and FIGS. 6b, 6d, 6f and 6h are schematic views from above of the stages shown in FIGS. 6a, 6c, 6e and 6g respectively.

FIGS. 7a to 7d are schematic representations illustrating the manufacture of a resonator according to a fifth embodiment of the invention in which the beam forming the resonator is locally oxidized using nitrogen implantation including selective oxidation of the mass, wherein FIGS. 7a and 7c are schematic cross-sectional representations showing stages of the method of manufacture, and FIGS. 7b and 7d are schematic representations taken from above of the stages shown in FIGS. 7a and 7c respectively.

DETAILED DESCRIPTION

Figure 1:
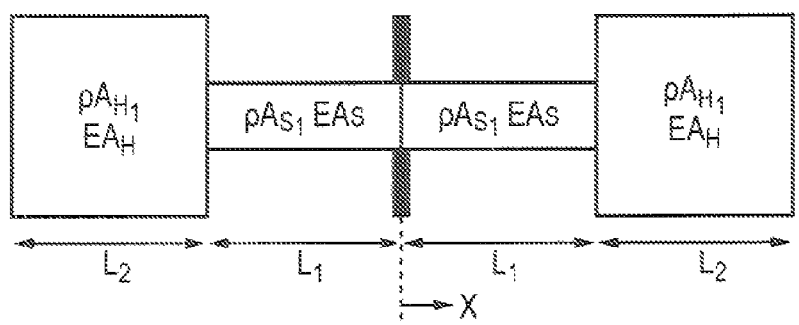
FIG. 1 is a schematic representation of a one dimensional model of a resonator according to the invention having a so-called dog bone shape.

According to a first aspect of the present invention there is provided a resonator comprising a beam formed from a first material having a first Young's modulus and a first temperature coefficient of the first Young's modulus, and a second material having a second Young's modulus and a second temperature coefficient of the second Young's modulus, a sign of the second temperature coefficient being opposite to a sign of the first temperature coefficient at least within operating conditions of the resonator, wherein the second material forms a layer on the first material, and wherein the ratio of the cross sectional area of the first material to the cross sectional area of the second material substantially varies along the length of the beam, the cross sectional areas being measured substantially perpendicularly to the beam.

The resonator may comprise a micromechanical resonator in which the first material comprises silicon, and the second material comprises an oxide, such as silicon dioxide.

The second material comprises a layer formed on, or around the first material and may for example form a skin around the first material.

Because it has not been possible previously to accurately the control the thickness of the second material, it has not been possible to completely compensate for the temperature dependency of the frequency of a silicon resonator.

Thus, although an oxide layer applied to silicon can reduce the temperature coefficient of the resonator, it has also resulted in an increase in the variance of the absolute frequency of the resonator. In other words, because the absolute frequency of the resonator is so strongly dependent on the oxide thickness, it has previously not been possible to accurately control the absolute frequency of a resonator.

The spread in absolute frequency is due to the 5% inaccuracy in measuring and controlling the thickness of an oxide layer. In addition, the variation in absolute frequency also depends on the gradient of the resonator frequency as a function of the oxide layer thickness. Whilst it is difficult, if not impossible, to obtain a better than 5% accuracy in the control of the thickness of the oxide layer, the inventors have realised that it is possible to reduce the dependence of the absolute frequency on temperature.

It is known that the frequency dependency of a resonator formed from a first material which is silicon is −377 ppm per nm of oxide layer. The inventors have realised that this value can be reduced by ensuring that the second material, which may be an oxide layer, has a thickness that varies in a predetermined manner, rather than a layer of substantially uniform thickness. More particularly, the inventors have realised that by varying the ratio of the cross-sectional area of the first material to the cross-sectional area of the second material at predetermined locations on the beam, the dependence of the absolute frequency on the thickness of the second layer may be reduced as will be explained hereinbelow.

The resonator may further comprise an anchor, and a free end, or tip.

The resonator operating at resonance may comprise a portion of the body acting as a mass in terms of a mass-spring-system, the lumped representation of any mechanical vibration. The portion nearest to the free end or tip contributes most to the mass. The point of suspension of the resonator body, known as the anchor, undergoes very little vibration. The portion of the body close to the anchor contributes most to the 'spring'-term, considering a lumped mass-spring-system.

In one embodiment of the invention, the thickness of the second material is greater at or near the anchor.

More particularly, on the spring part of the resonator, which is located near the anchor or anchors, the ratio of the cross-sectional area of the first material to the cross-sectional area of the second material should be in the region of 2:1. At the mass part of the resonator towards the free end of the beam, this ratio should be about five times smaller. This means that if the ratio of the cross-sectional area of the first material to the cross-sectional area of the second material at or close to the anchor is 2:1 then it should be 10:1 towards the free end.

One way in which the ratio of the cross-sectional area of the first material to the cross-sectional area of the second material may be varied is by varying the thickness of the second material at predetermined positions along the beam. Alternatively the relative proportion of the first material in a cross-section that is transferred to the second material may be varied.

When the first material comprises silicon and the second material comprises silicon dioxide, this process of thermal oxidation takes place on the exposed surface of the resonator. It is likely therefore that the resulting thickness of the second material is uniformly equal on all surfaces of the resonator. Implants of certain atoms into the resonator can either enhance or inhibit the rate of oxidation. A localized implant hence causes a localized change of rate of oxide layer growth. In that way, the oxide thickness along the beam may be varied.

Alternatively, one can vary the relative proportion of the first material to the second material. When the second material is equally thick all over the resonator, but, for example, the thickness of the first material varies along the length of the beam, then with a uniform thickness of the second material, there will be varying relative proportions of the two materials along the resonator.

The problem of the receding resonance frequency as a function of oxide thickness can be understood when considering the following example.

A beam in longitudinal resonance vibrates at an angular frequency with a displacement function along its length, u(x), that is a solution of the differential equation $$\frac{\partial}{\partial x}\left[EA(x)\frac{\partial u(x)}{\partial x}\right] = -\omega^2 \rho A(x)u(x), \quad (1)$$

where E is the material's modulus of elasticity, or Young's modulus, A is the cross-sectional area and is the mass density. For a uniform beam, the area A is usually divided out.

The absolute frequency of a free-free beam of a single material of uniform cross-section is geometrically related only to the length L of the beam and is expressed as $$\omega_0 = \frac{\pi}{2L}\sqrt{\frac{E}{\rho}}. \quad (2)$$

A free-free beam as an extensional MEMS resonator is a resonator having a width that is much larger than its thickness. A free-free beam may thus be regarded as having a top surface and an opposite bottom surface together with two opposite side walls. Oxidation is then considered as the consumption of silicon from top and bottom surfaces of the beam. The consumption of silicon at the sidewalls may be disregarded since a free-free beam is a very wide and thin structure.

The terms "top" and "bottom" are used herein order to simplify the description and are not to be construed as implying a particular orientation of the resonator.

The effective mass-per-meter A and the stiffness term EA can be monitored before and after complete oxidation. Area A is now included, even though a solution for a single material free-free beam results in a frequency expression containing the square root of E/. The regular frequency-expression for such a beam, Eq. (2), does not include A, nor would the differential equation Eq. (1) if A were divided out. Since in what follows we study two materials and the cross-sectional areas of these two materials, we find it convenient to leave A in Eq. (1) and observe the quantities mass-per-meter A and the stiffness term EA in Eq. (1).

The material properties used are $E_{Si}$=131 GPa, $E_{SiO2}$=72 GPa, $_{Si}$=2330, $_{SiO2}$=2200.

If the cross-sectional area before oxidation is 1, then the cross-sectional area of the first material after oxidation (assuming complete transformation of the first material into the second material; in reality complete transformation will not occur) is 2.27, due to the silicon consumption fraction of v=0.44. When a first material formed from silicon has an oxide layer (a second material) grown on it, the silicon surface oxidizes and a silicon dioxide layer of a given thickness, for example 1 micron results. However, the original surface of the silicon is not 1 micron below the new surface. Due to the consumption factor, v, it is known that 44% of the 1 micron thick layer is consumed into the silicon. This means that $EA_{before}$ = 131 · 1    $EA_{after}$ = 72 · 2.27    scales as: 1: 1.24 or +24%
$A_{before}$ = 2330 · 1    $A_{after}$ = 2200 · 2.27    scales as: 1: 2.14 or +114%

From this simple, but crude, approximation, it can be seen that both stiffness and mass increase after oxidation, but at different rates. The increase in mass is about 4.5 times larger than that of stiffness. During oxidation, as a function of oxide thickness, the rate ratio at which EA and A change remains roughly at 4.5.

As a result of the different rates at which stiffness and mass change, the frequency of the resonator reduces during oxidation. The fundamental frequency of a free-free beam of a single material of uniform cross-section may be expressed as $$\omega_0 = \frac{\pi}{2L}\sqrt{\frac{EA}{\rho A}}, \quad (3)$$

in which the length is considered to be constant.

In the square root factor, we find the ratio of effective material properties.

The product E*A comprises two materials with two different E's and two areas A for the two materials. This calculation can be replaced in an expression as Eq. (3) by the effective constants. Taking a virtual material with certain Young's modulus E and making it have a cross-sectional area A in such a way that this virtual beam will have the same stiffness property (and doing the same calculation for mass) as a beam consisting of two materials each with their own area A. The inventors have realized that if these properties are altered, then the absolute frequency of the free-free beam may also be altered.

For a free-free beam, the resonance frequency, the vibration mode-shape and the kinetic and potential energies are closely related to each other. Analogous to the expression for the frequency of a lumped mass and spring resonator $$\omega = \sqrt{\frac{k}{m}}, \quad (4)$$

with stiffness k and mass m, the Rayleigh quotient can be applied to a continuous body in resonance. The Rayleigh quotient reads $$\omega^2 = \frac{\int_L EA\left(\frac{\partial u(x)}{\partial x}\right)^2 dx}{\int_L \rho A(u(x))^2 dx}. \quad (5)$$

For a rod in one-dimensional resonance, the Rayleigh quotient (in this form for extensional resonance) relates the resonance modeshape u(x) to the resonance frequency by equating the potential energy at maximum deflection to the reference kinetic energy at maximum velocity. For a free-free beam, the differential equation for extensional vibration can be solved exactly and this results in the fundamental mode shape being u(x)=sin(x/2L).

The integrals over the squared modeshape and over the squared derivative of the modeshape, taking into account the local values for EA(x) and A(x), constitute the energies. The kinetic energy (denominator in Eq. (5), corresponding to mass m in Eq. (4)) is largely built up at the tip of the resonator, while the displacements near the anchor are zero. The potential energy (numerator in Eq. (5), corresponding to stiffness k in Eq. (4)), related to the strain, is on the other hand largely built up near the anchor.

For uniform oxidation along the length of a beam, mass A and stiffness EA will grow at rates differing by a factor 4.5. The potential and kinetic energies will grow likewise.

However, knowing that both energies have partly separated regions of interest, it is possible to equalize the increase of the potential and kinetic energy as the oxide layer grows, by varying the rates of oxidation near the anchor and tip. By varying the rates of oxidation near the anchor and the tip, during an oxidation process having a given duration, the oxide layer will be thicker in areas where the rate of oxidation is greater.

Since mass or kinetic energy grows 4.5 times faster, than stiffness or potential energy, a 4.5 times faster oxidation rate should be achieved near the anchor to account for the potential energy.

The thickness of the first material may be substantially constant along the length of the beam, and the thickness of the second material may vary along the length of the beam. In particular, the thickness of the second material may be greater near to the anchor.

The resonator should, therefore, oxidize faster near the anchor. One way to achieve this would be to provide a larger beam circumference. With the same cross-sectional area A, the circumference of the beam can be increased by sectioning this area. This may be achieved by forming slits along the direction of beam. Sidewall oxidation should no longer be excluded from the analysis, since the addition of slits generates extra sidewalls.

In some embodiments in accordance with the invention therefore, the beam comprises one or more slits extending longitudinally along at least part of the length of the beam. This increases the circumference of the beam. In other embodiments in accordance with the invention, the beam circumference may be increased by different means.

In embodiments in accordance with the invention comprising an anchor, the slits may extend from a location at or close to the anchor and may extend towards the free end of the beam.

Alternatively, rather than forming slits in the resonator, the side wall oxidation may be enhanced such that the thickness of the oxide layer on the side walls of the beam is greater than the thickness of the oxidation on the top and bottom walls of the beam. This is explained in the following text.

In some embodiments in accordance with the invention therefore the beam may be regarded as comprising a top surface, a bottom surface, and two opposite side walls, and the second material may form a skin around the top, bottom and side walls of the beam, the thickness of the second material over the side walls being greater than the thickness of the second material over the top and bottom surfaces of the beam.

Another way to achieve faster oxidation is through process technology. The first material may for example be doped, and the level of doping may vary along the length of the beam. By having different doping levels near the anchor and tip, the oxidation rates in these areas can be controlled separately.

In some embodiments in accordance with the invention therefore the first material may be doped, and the level of doping may vary along the length of the beam.

Impurity enhanced oxidation may be used for making resonators with locally oxidised parts as described hereinabove. The effect of impurity enhanced oxidation is known for the case of phosphorous doping. To achieve a significant contrast in oxide thickness in doped areas versus undoped or lightly doped areas, a significant dose of impurity is required. In the case of phosphorus doping, the dose should be close to the solubility limit.

For the case of MEMS devices, generally, a symmetric (from top to bottom) doping is required to avoid unwanted stress or bending in the structures. In some embodiments in accordance with the invention therefore it may be advantageous to ensure that the doping is symmetric through the thickness of the beam.

For thin MEMS structures, locally a high uniform doping across the full thickness of the structure can be obtained, thus creating symmetry between the top and bottom of the structure.

For thicker structures, a uniform doping at a high doping level becomes practically impossible. In these cases doping of the sidewalls can be used. After locally creating highly doped sidewalls, subsequent oxidation under appropriate oxidation conditions will create a desired enhanced oxidation rates in these areas. Local doping of the sidewalls can be implemented either using tilted implant, or using a diffusion source.

In order to achieve a temperature independent spring constant, the spring (or beam) should comprise roughly 66% of the first material and 33% of the second material by a cross-sectional area. This may be difficult to achieve when using locally enhanced oxidation techniques. This is because the oxide/silicon structure must be vertically symmetric about the centre of the resonator in the plane of the silicon layer in order to avoid the resonator bending out of plane.

This requirement, combined with the constraints imposed by limited implant dose, energy and a low diffusion of the relevant implant species means that it may often be impractical to attempt to enhance the oxidation layer in the vertical direction. This is because it may be difficult to match the oxide thicknesses on the top and bottom of the spring in order to maintain the symmetry of the spring. It is for this reason that the enhancement of the oxide layer may take place on the spring side walls as described hereinabove. This enables the vertical symmetry of the structure to be maintained although constraints are put upon the resonator geometry. In particular, the springs must be narrow enough so that 30% of the silicon is oxidised in the lateral direction which results in a ratio of 2:1 silicon to silicon dioxide following oxidation.

Under certain circumstances, and particularly if both lateral and vertical oxide growth is required, a species, for example nitrogen, may be selectively implanted into the support regions of the resonator structure.

Once a species such as nitrogen has been implanted, high temperature annealing may be used to cause the species to diffuse into the silicon surfaces and form a nitrogen rich region that impedes oxygen diffusion and so blocks oxidation. This enables total suppression of the oxidisation layer to be achieved, which in turn means that small variations in the nitrogen implant dose do not result in frequency variations.

Local oxidation regions may also be patterned on the mass regions in order to eliminate the sensitivity of the room-temperature resonant frequency to process variations during oxidation.

According to a second aspect of the present invention there is provided a method of manufacturing a MEMS resonator comprising the steps of:

forming a beam from a first material;
coating the beam with a second material;
such that the ratio of the cross-sectional area of the first material to the cross-sectional area of the second material varies along the length of the beam.

In some embodiments in accordance with the invention, the ratio of the cross-sectional area of the first material to the cross-sectional area of the second material is varied, thereby varying the rate at which the second material is coated onto the first material.

In other embodiments in accordance with the invention the ratio of the cross-sectional area of the first material to the cross-sectional area of the second material is varied by forming the beam from a first material having a cross-sectional area that varies along the length of the beam.

The beam may be formed a silicon substrate, which substrate may be coated with a silicon dioxide layer.

In such embodiments in accordance with the invention, prior to the step of coating the beam with silicon dioxide, the step of implanting the silicon substrate with an impurity such that the concentration of the impurity varies along the length of the beam may be carried out.

To describe the benefits of local enhanced thermal oxidation, a model may be derived to predict the resonance frequency of such a resonator.

Referring to FIG. 1, a one dimensional mode of a resonator 2 is illustrated schematically and has a so-called dogbone shape. The resonator may be regarded as having two heads 4 and two beams 6 (springs). Because the configuration is symmetrical, the resonator 2 may be regarded as a two part continuous body in which the length of each head 4 is denoted by the reference L2 and the length of each spring 6 is denoted by the reference L1. The resonator 2 may be regarded as a one-dimensional resonator in which the springs and head (6 and 4) resonate in the direction indicated by the letter x.

The analysis of such a two-section, two-material free-free beam 6 starts with the differential equation $$\frac{\partial}{\partial x}\left[EA(x)\frac{\partial u(x)}{\partial x}\right] = -\omega^2 \rho A(x) u(x), \tag{6}$$

where resultant forces due to strain equal acceleration of mass throughout the beam. This equation has to hold for all of the beam and for the two parts separately. It is necessary to consider only two parts, since the actual resonator is symmetric and is hence only modeled from one head 4 and one spring 6. The combination of mass and spring is only fixed at the point x=0.

Within each section, the cross section is constant and Eq. (6) above is reduced to $$u_i'' + \beta_i^2 u_i = 0 \text{ with } \beta_i^2 = \frac{\omega^2 (\rho A)_i}{(EA)_i}, \tag{7}$$

where effectively two differential equations are written with index i=H,S for the two parts, head and spring, respectively.

Unlike the case for a single material free-free beam, the spatial wavelength of the standing wave or mode shape at resonance is not the same for the two parts. There are two coupled differential equations of second order and four boundary conditions. Displacement at the anchor and strain at the free end are zero (conditions 1 and 2). At the interface continuity in u(x) and continuity in EA(x)du/dx have to be provided (conditions 3 and 4). An additional 'condition' of scalability of the modeshape is applied. Solving the coupled equations leads for the fundamental resonance to the expression $$\beta_H^2 = \frac{6(EA)_S (\rho A)_H}{3(EA)_S L_2^2 (\rho A)_H + 2(EA)_H L_1 (L_1 (\rho A)_S + 3L_2 (\rho A)_H)}, \tag{8}$$

from which can be found. Intentionally, the areas A are not divided out. The effective parameters EAi and Ai depend on the thickness of the oxide layer (second material) and the material properties of silicon (first material) and silicon dioxide. Expression (8) can be brought to $$\beta_H^2 = \frac{6}{3L_2^2 + 2\frac{(EA)_H}{(EA)_S}L_1\left(L_1\frac{(\rho A)_S}{(\rho A)_H} + 3L_2\right)}, \tag{9}$$

making clear that the changing ratios of effective material properties will alter the resonance frequency as the frequency omega (omega=2*π*f) relates to $\beta_H$ as $$\omega^2 = \frac{\beta_H^2 (EA)_H}{(\rho A)_H}. \tag{10}$$

When head 4 and beam 6 are oxidized at the same rate and have equal cross-sectional area, the two ratios in the denominator of Eq. (9) equal one, and the ratio in Eq. (10) shows that the resonator experiences a reduction in frequency during oxidation since the effective mass ρ*A increases typically faster than the effective stiffness. This was shown earlier in the text considering the complete oxidation of a piece of silicon. When head 4 and beam 6 are oxidized at the same rate but have different cross-sectional areas, the ratio's in Eq. (9) are not 1 and the evolution of frequency (Eq. (10)) will be different than the earlier reported –377 ppm per nanometer of oxide.

The closed-form expression for the resonance frequency of the composite free-free beam (Eqs. 9 and 10) depends on the effective properties of the two cross-sections. For the head, with uniform oxidation along the perimeter, we find $$\rho A_H(\tau) = [\rho_1 w_H h + \rho_2 (-h w_H + (h+2\tau)(w_H+2\tau))]$$

$$EA_H(\tau) = [E_1 w_H h + E_2 (-h w_H + (h+2\tau)(w_H+2\tau))], \tag{11}$$

where $$h = h_0 - 2\nu\tau \text{ and } w_H = w_{H,0} - 2\nu\tau. \tag{12}$$

The thickness of the oxide layer is denoted as. For the spring 6 we first consider the case of chemical enhancement of the oxidation rate by a certain amplification factor phi and we can write $$\rho A_S(\tau) = n_S \cdot \rho A_S^* = n_S [\rho_1 w_S h + \rho_2 (-h w_S + (h+2\varphi\tau)(w_S+2\varphi\tau))] \tag{13}$$

$$EA_S(\tau) = n_S \cdot EA_S^* = n_S [E_1 w_S h + \rho_2 (-h w_S + (h+2\varphi\tau)(w_S+2\varphi\tau))],$$

where $$h = h_0 - 2\nu\varphi\tau \text{ and } w_S = \left(\frac{w_{S,0}}{n_S}\right) - 2\nu\varphi\tau. \tag{14}$$

The spring 6 is assumed to be divided in more than one section (number of sections $n_S$) and be doped such, that the oxide thickness is enhanced by a factor. Again, denotes the consumption rate of silicon (0.44). The initial thickness $h_0$ is equal for both the spring and the head as this thickness corresponds to the Silicon-on-Insulator wafer material.

Using the effective properties and the closed-form expression for frequency, the absolute frequency can be calculated as a function of oxide thickness. In the following example, we use a resonator with the following dimensioning before oxidation.

| $L_1$ | $L_2$ | $W_S$ | $n_S$ | $w_H$ |
|---|---|---|---|---|
| 20 m | 35 m | 20 m | 2 | 4 | 64 m |

Using these values, the resonance frequency can be calculated.

It is known that the frequency of the resonator varies parabolically with the oxide thickness. The parabolic nature of the frequency occurs due to the dimensions of the resonator and the enhancement factor=4. Otherwise, a receding frequency of nearly linear behavior would be observed. Because of the ratio of ~3 of head-width compared to total spring-width, (64/20) the modeshape is far from a spatial sinewave. It tends more to a distinction where nearly all strain is in the spring part and the largest displacements are in the head. The ideal situation of rigid mass and massless spring, as in an elementary M and K situation, is not, and cannot, be reached as will become clear when inspecting the effective material properties for the two parts.

The rates at which the effective material properties change in the spring 6 and the head 4 can be controlled by the enhancement factor phi. In a crude approximation, the mass increase in the head is compared to the increase in stiffness in the spring, as explained earlier. This led to a required enhancement factor phi=4.5 since the mass increase was 4.5 times larger than the stiffness increase. The effective material properties are now fed to the 1D model (Eqs. (9-14)), yielding a more accurate description of the evolution of the resonance frequency during oxidation.

Figure 2:
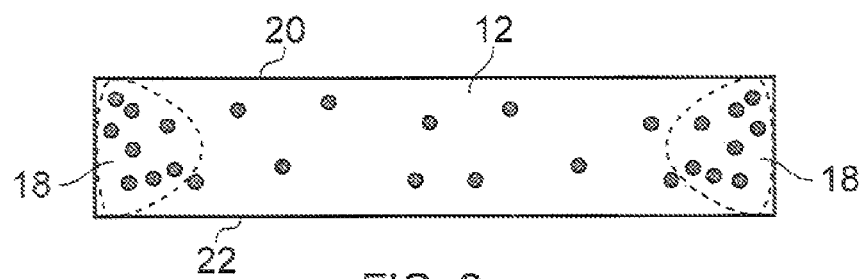
FIG. 2 is a cross-sectional schematic representation of a beam forming a resonator according to a first embodiment of the invention in which the beam is doped in order to achieve a localised variation in the thickness of an oxide layer formed on the silicon substrate.
Figure 3B:
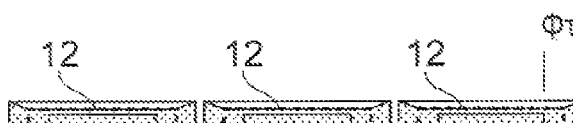
FIGS. 3*a*, 3*b* and 3*c* are schematic representations of a resonator comprising three beams of the type shown in FIG. 2.
Figure 3C:
Figure 3A:
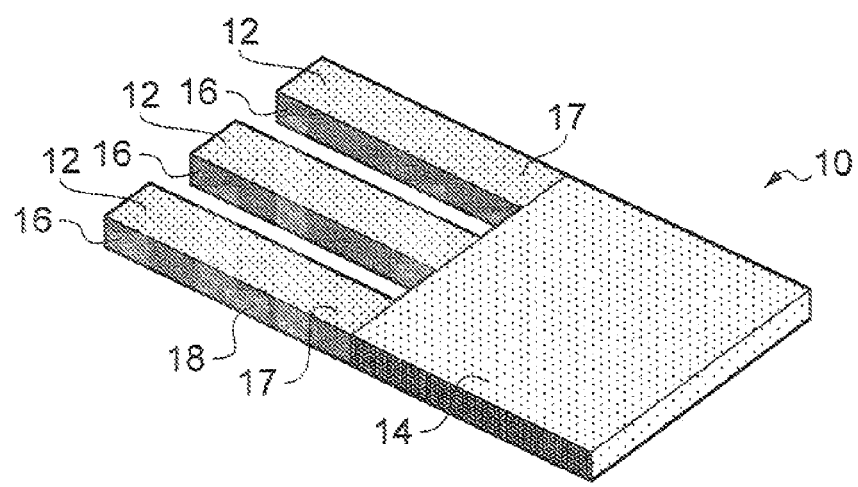

For both parts, the ratio at which A increases faster than EA is equal and about 4.5. In the case of enhanced oxidation, however, both gradients are larger than for the other part. In other words, for the portion of the resonator where the chemical enhancement of oxidation rate is realized, both the effective stiffness as well as the effective mass will grow faster, compared to these effective parameters in the unenhanced portion of the beam. The rate at which the stiffness increases in the spring is nearly equal to the rate at which the mass increases in the head. Referring to FIGS. 2 and 3a to 3c, a first embodiment of the invention is illustrated schematically and is designated generally by the reference numeral 10. The resonator 10 comprises three beams (or springs) 12 and a mass 14. Each beam 12 comprises a free end or tip 16, side walls 18, and top 20, and bottom walls 22. The beams are effectively anchored to the mass at anchors 17. The mass 14 acts as an anchor to each beam 12. The free end 16 of each beam 12 may be regarded as the tip of the respective beam 12. Each beam 12 is formed from a first material comprising silicon. The silicon is highly doped locally at the side walls 18 as illustrated in FIG. 2, in order that the thickness of the second material, which in this case is silicon dioxide may be enhanced. In this embodiment, the thickness of the second material is enhanced at the side walls and is thus thicker than over the top and bottom walls 20, 22 respectively. This technique is known as enhanced side wall oxidation. At the sidewalls the thickness of the second material should generally be more than one micron thick, according to calculations.

As explained hereinabove, this leads to a reduction of the frequency change of the resonator as a function of the oxide thickness.

Referring to FIGS. 4a to 4f, a resonator 40 according to a second embodiment of the invention, together with a method for manufacturing the resonator are illustrated schematically.

Figure 4A:
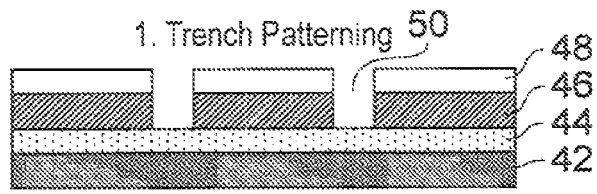
FIGS. 4a to 4e are schematic representations of a resonator according to a second embodiment of the invention in which phosphorus is implanted into a silicon substrate from which the resonator is formed in order to achieve a variation in the thickness of an oxide layer formed on the silicon substrate.

As shown in FIG. 4a, a substrate of silicon 42 is coated with a layer of silicon oxide 44 that forms a Buried Oxide Layer (BOX). A second layer of silicon 46 is deposited on the silicon dioxide layer 44 and a second layer of silicon dioxide 48 is deposited onto the second layer of silicon 46. Trenches 50 are then patterned into the composite substrate in a known manner.

The second layer of silicon dioxide comprises an oxide hard mask 48 which is used for the trench patterning. The mask 48 is not removed after the trench is formed, but will be used later to avoid implantation of dopants into the top of the resonator during implantation.

Figure 4B:
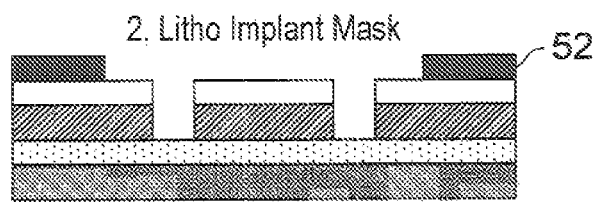
Figure 4C:
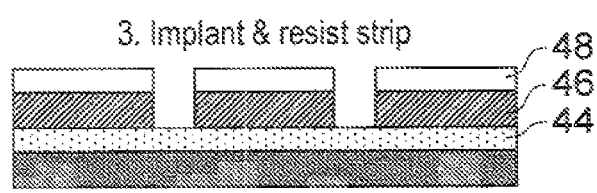

As shown in FIG. 4b an implant mask 52 is defined in resist using lithographic techniques. The implant mask 52 is also shown in FIG. 4f.

The open areas in the implant mask 52 define the areas that will obtain a side wall implant. In order to obtain sufficient enhancement of the oxide growth rate, an implant dose of orders of magnitude larger than required for regular operation of the MEMS device is required in this step. The result of the side wall implant after the resist mask has been stripped is shown in FIG. 4c.

Figure 4D:
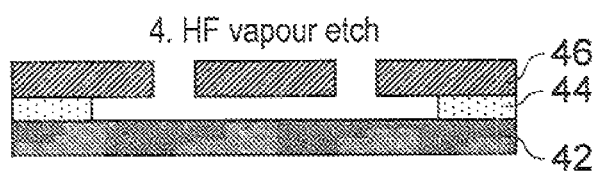

Next, an HF vapour etch step as shown in FIG. 4d is used to remove the buried oxide (BOX) layer 44 in the area that will be underneath the subsequently formed MEMS resonator 40. The oxide hard mask 48 on top of the silicon 46 is removed in the same step.

Figure 4E:
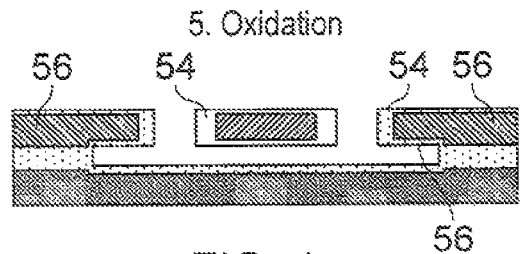
Figure 4F:
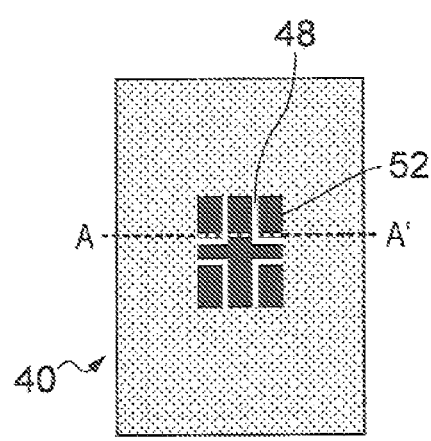
FIG. 4f is a schematic view from above of the resonator of FIGS. 4a to 4e.

Using appropriate oxidation parameters, an oxide layer 54 having a thickness that will ensure the 2:1 ratio material presence of silicon to silicon-dioxide may be formed at the side walls of the beam which have been implanted in the step shown in FIG. 4c. Considering side-wall oxidation only, it is the width of the initial silicon structure that determines the required thickness of the thick oxide layer. Typically the thickness will be in the range of up to 1 micron. The thickness of the oxide layer 56 formed at other areas of the beam is much smaller, as shown in FIG. 4e. Depending on the degree of oxidation acceleration achieved by the implant, the thickness in the other areas will be factors lower. For a thickness of 1 micron for the enhanced areas, this leads to thicknesses in the un-enhanced areas of about 200 nm.

Turning now to FIGS. 5a to 5g, a resonator 60 according to a third embodiment of the invention is illustrated schematically, together with a method of manufacturing the resonator. Parts of the resonator 60 which correspond to the resonator illustrated in FIGS. 4a to 4f have been given corresponding reference numerals for ease of reference.

Figure 5A:
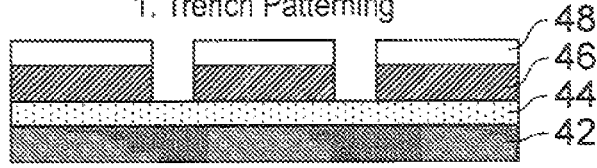
FIGS. 5a to 5f are schematic representations of a resonator according to a third embodiment of the invention including a diffusion source.

The first step illustrated in FIG. 5a is similar to that of the first step shown in FIG. 4a in connection with the second embodiment of the invention. In this embodiment, the hard mask 48 is also not removed after the forming of the trenches 50, but is used to protect the top of the resonator 60 when a dopant diffusion source is applied.

Figure 5B:
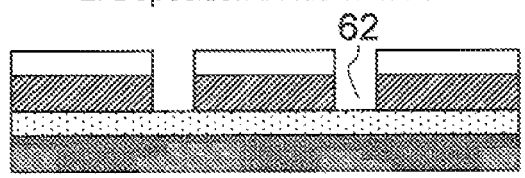

In the second step shown in FIG. 5b, a diffusion mask 62 is applied. The diffusion mask may be for example a layer of TEOS (tetraethyl orthosilicate) having a thickness of approximately 50 nm which is deposited using LPCVD. Other methods for forming the diffusion mask such as PECVD deposition or oxidation are also possible.

Figure 5C:
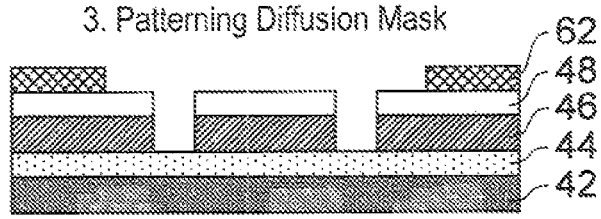

In step three, as shown in FIG. 5c, the diffusion mask 62 is patterned using lithographic techniques, followed by an isotropic etch step. This etch step may be for example, a wet oxide etch. The use of an isotropic etch is required because the oxide 54 on the side walls needs to be removed in the open areas of the diffusion mask.

Figure 5D:
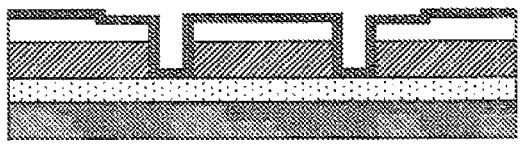

In step 4, as shown in FIG. 5d a diffusion source is deposited, followed by a driving step. The driving step comprises a thermal treatment step using rapid thermal processing, or a furnace. In the case of P doping, PSG is deposited in PECVD or LPCVD. Alternatively a spin-on dopant may be used.

Other dopants such as boron or arsenic may also be used.

Figure 5E:
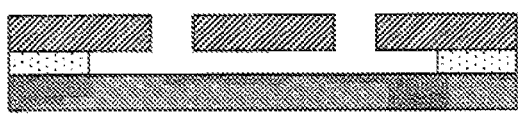

In step 5, as shown in FIG. 5e, the HF vapour etch step is used to remove the buried oxide (BOX) layer 44 for realising the MEMS structure. The oxide hard mask and the diffusion source are removed at the same time. If necessary the diffusion source may be removed before the HF vapour etch step.

Figure 5F:
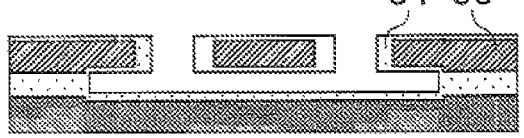
Figure 5G:
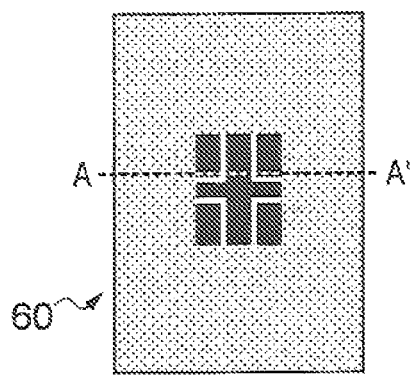
FIG. 5g is a schematic view from above of the resonator illustrated in FIGS. 5a to 5f.

Oxidation provides a thick oxide layer 54 at the highly doped side walls and a thin oxide layer 56 on all of the surfaces as shown in FIG. 5f.

Referring to FIGS. 6a to 6h, a resonator 70 according to a fourth embodiment of the invention is illustrated schematically together with a method of manufacturing such a resonator.

The resonator 70 comprises a substrate 72 formed from silicon on which has been deposited a layer of silicon dioxide 74 which will form a buried oxide layer. On top of the buried oxide layer 74, a silicon on insulator layer (SOI) 76 is deposited.

As shown in these figures, after covering a central portion 78 of the resonator, a nitrogen-implant (FIGS. 6a and 6b) will affect only the uncovered outer portions. The nitrogen is implanted vertically as represented by the arrows in FIG. 6a. After the implant and a release etch and the removal of the hard mask 80 (FIGS. 6c and 6d) a suspended MEMS resonator results with a high N-concentration in the implanted regions. An anneal step diffuses the concentration profile to the surfaces of the resonator (FIGS. 6e and 6f). When this resonator 70 is exposed to thermal oxidation, the oxidation rate in the treated portions will be very low and a silicon-dioxide layer 82 will grow only in the central portion 78 (FIGS. 6g and 6h).

Figure 6A:
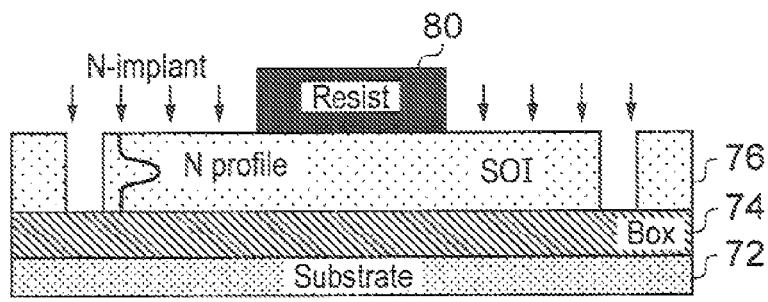
Figure 6B:
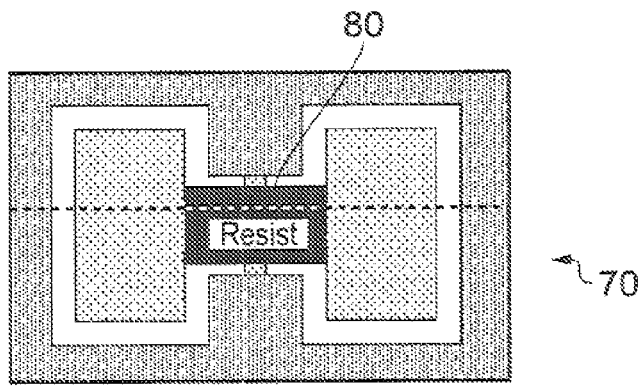
Figure 6C:
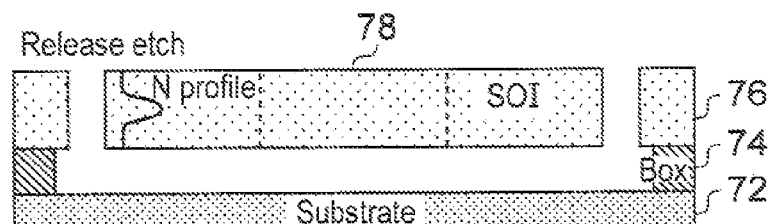
Figure 6D:
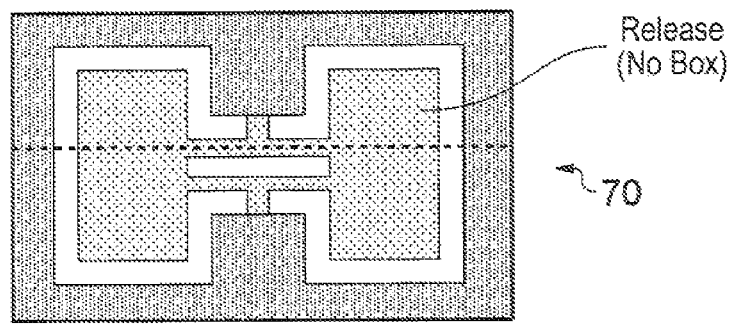
Figure 6E:
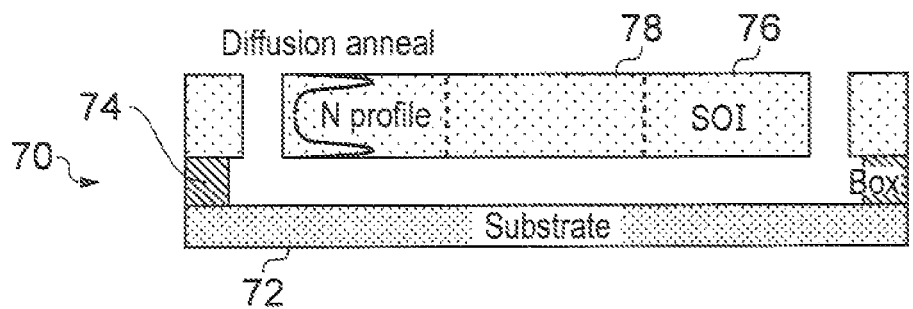
Figure 6F:
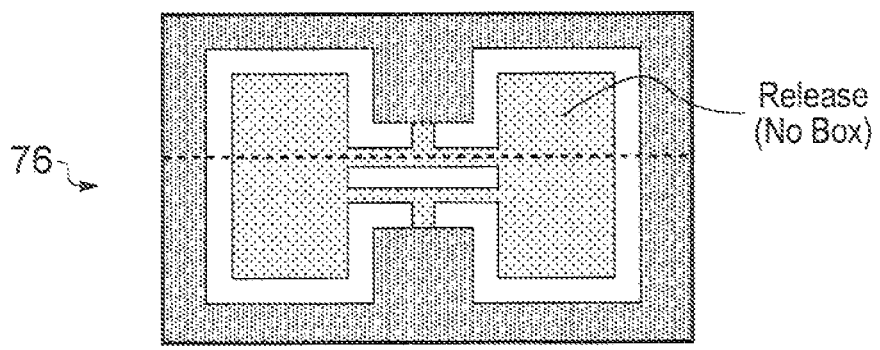
Figure 6G:
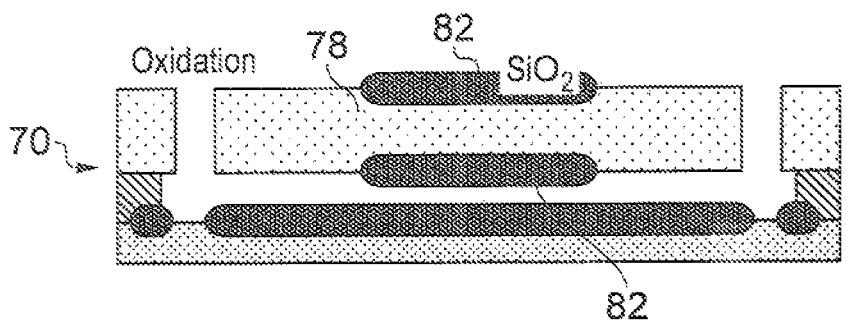
Figure 6H:
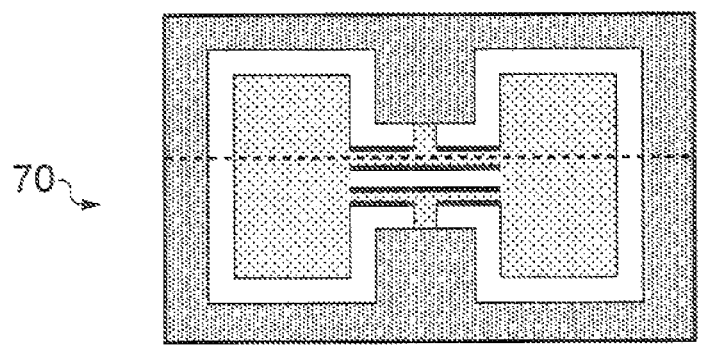
Figure 7A:
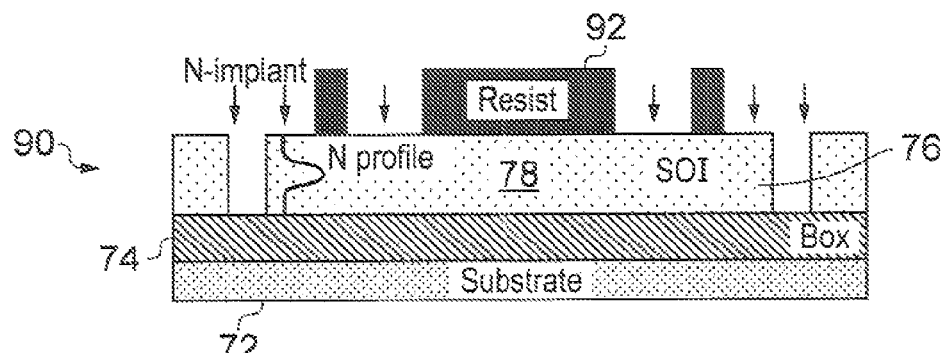
Figure 7B:
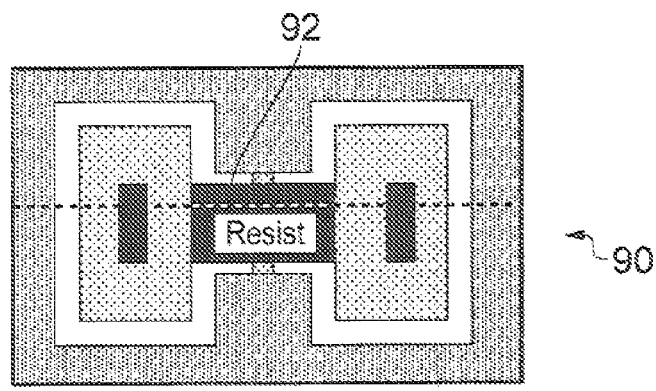
Figure 7C:
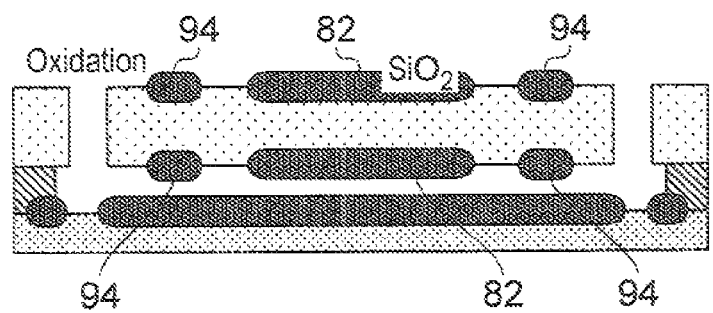
Figure 7D:
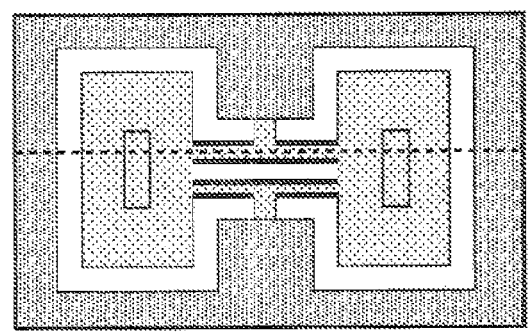

Nitrogen is implanted vertically as represented by the arrows in FIG. 6a into the centre of the mass of a free-free beam resonator. Following release etch, the nitrogen is diffused to the interfaces at high temperature where it blocks oxidation following the subsequent oxidation step.

FIGS. 7a to 7d illustrate an enhancement of the method shown in FIGS. 6a to 6h and illustrate a resonator 90 according to a fifth embodiment of the invention. Parts of the resonator 90 that correspond to parts of the resonator 70 described above have been given corresponding reference numerals for ease of reference. In this method, selected regions of the beam are defined by lithography such that they are oxidised along with the beams. Tuning of the area of mass to be oxidised enables the frequency reduction, due to additional mass, to be compensated by the increased spring constant due to oxidation of the springs.

The process steps shown in these figures are similar to those described in FIGS. 6a to 6h. In particular, a hard mask 92 differs from the hard mask 78 described hereinabove with reference to the fourth embodiment of the invention. The hard mask 92 covers not only a central region of the silicon on insulated layer 76, but also covers predetermined other areas as shown particularly in FIG. 7a. This means that the resonator 90 has additional areas of silicon dioxide growth 94 in addition to the silicon dioxide layer 82 which corresponds to the silicon dioxide layer 82 described hereinabove with reference to the further embodiment of the invention.

The invention claimed is:

1. A resonator comprising a beam formed from a first material having a first Young's modulus and a first temperature coefficient of the first Young's modulus, and a second material having a second Young's modulus and a second temperature coefficient of the second Young's modulus, a sign of the second temperature coefficient being opposite to a sign of the first temperature coefficient at least within operating conditions of the resonator, wherein the second material forms a layer on the first material, and wherein the ratio of the cross sectional area of the first material to the cross sectional area of the second material varies along the length of the beam, the cross sectional areas being measured substantially perpendicularly to the beam.

2. A resonator according to claim 1 comprising a MEMS resonator wherein the first material comprises silicon.

3. A resonator according to claim 1 wherein the second material comprises silicon dioxide.

4. A resonator according to claim 1 further comprising an anchor, the beam having a tip spaced apart from the anchor.

5. A resonator according to claim 4 wherein the thickness of the second material is greater at or near the anchor.

6. A resonator according to claim 1 wherein the thickness of the first material is substantially constant along the length of the beam, and the thickness of the second material varies along the length of the beam.

7. A resonator according to claim 1 comprising a plurality of slits formed in the beam and extending longitudinally along at least part of the length of the beam.

8. A resonator according to claim 1 wherein the beam comprises a top surface and an opposite bottom surface and two opposite side walls, and wherein the second material forms a skin around the top, bottom and side walls of the beam, the thickness of the second material over the side walls being greater than the thickness of the second material over the top and bottom surfaces of the beam.

9. A resonator according to claim 1 wherein the first material is doped, and the level of doping varies along the length of the beam.

10. A method of manufacturing a MEMS resonator comprising the steps of:
    forming a beam from a first material;
    coating the beam with a second material;
    such that the ratio of the cross-sectional area of the first material to the cross-sectional area of the second material varies along the length of the beam.

11. A method according to claim 10 wherein the ratio of the cross-sectional area of the first material to the cross-sectional area of the second material is varied by varying the rate at which the second material is coated onto the first material.

12. A method according to claim 11 wherein the ratio of the cross-sectional area of the first material to the cross-sectional area of the second material is varied by forming the beam from a first material having a cross-sectional area that varies along the length of the beam.

13. A method of manufacturing a MEMS resonator according to any one of claim 10 comprising the steps of forming the beam from a silicon substrate and coating the silicon substrate with a silicon oxide layer.

14. A method according to claim 13 wherein prior to the step of coating the beam with silicon dioxide the following further step is carried out:
    implanting the silicon substrate with an impurity such that the concentration of the impurity varies along the length of the beam.

* * * * *